United States Patent
Islam et al.

(10) Patent No.: US 10,878,899 B1
(45) Date of Patent: Dec. 29, 2020

(54) LOW VOLTAGE, LOW POWER SENSING BASED ON LEVEL SHIFTING SENSING CIRCUIT

(71) Applicant: Intel Corporation, Santa Clara, CA (US)

(72) Inventors: Ashraf B. Islam, El Dorado Hills, CA (US); Jaydip B. Patel, Folsom, CA (US); Balaji Srinivasan, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/586,651

(22) Filed: Sep. 27, 2019

(51) Int. Cl.
*G11C 11/56* (2006.01)
*H03F 3/45* (2006.01)
*G11C 16/12* (2006.01)

(52) U.S. Cl.
CPC ...... *G11C 11/5642* (2013.01); *G11C 11/5628* (2013.01); *G11C 16/12* (2013.01); *H03F 3/45071* (2013.01)

(58) Field of Classification Search
CPC ........ H03K 19/018521; H01L 2924/00; H01L 2924/0002; B60L 58/10; G11C 7/12; G11C 11/5642; G11C 11/5628; G11C 16/12; H03F 3/45071
See application file for complete search history.

(56) References Cited

U.S. PATENT DOCUMENTS

| 2006/0062042 | A1* | 3/2006 | Karlsson | G11C 11/22 365/145 |
| 2008/0007316 | A1* | 1/2008 | Chen | H03K 19/018571 327/333 |
| 2009/0103365 | A1* | 4/2009 | Roohparvar | G11C 16/0483 365/185.17 |
| 2011/0176356 | A1* | 7/2011 | Kajigaya | G11C 8/12 365/149 |
| 2013/0182514 | A1 | 7/2013 | Ge et al. | |
| 2014/0233331 | A1 | 8/2014 | Foong et al. | |
| 2016/0372162 | A1 | 12/2016 | Choi | |
| 2017/0011794 | A1 | 1/2017 | Nii et al. | |
| 2017/0229188 | A1 | 8/2017 | Kim | |
| 2017/0359272 | A1* | 12/2017 | Srinivasan | H04L 47/808 |
| 2018/0061461 | A1 | 3/2018 | Seo | |
| 2018/0151233 | A1 | 5/2018 | Otsuka | |

(Continued)

FOREIGN PATENT DOCUMENTS

EP 2804317 A1 11/2014

OTHER PUBLICATIONS

Brooks, Sarah; Cicchetti, Anthony; "Design of a Low Power Latch Based SRAM Sense Amplifier", Mar. 27, 2014, 86 pages.

(Continued)

*Primary Examiner* — Sibin Chen
(74) *Attorney, Agent, or Firm* — Compass IP Law PC

(57) ABSTRACT

A sensing circuit for sensing an analog signal includes a level shifter that shifts the analog signal from a high voltage domain to a low voltage domain. The signal originates from the high voltage domain, and is passed to the low voltage domain through the level shifter. A source line provides the analog signal, which can be selectively switched into a sense amplifier circuit. The sense amplifier is in the low voltage domain and generates a digital output to represent the sensed analog signal.

21 Claims, 9 Drawing Sheets

(56) References Cited

U.S. PATENT DOCUMENTS

2018/0308529 A1   10/2018  Willcock et al.
2019/0164579 A1    5/2019  Glazewski et al.
2020/0083901 A1*  3/2020  Adusumalli ............ B60L 58/22

OTHER PUBLICATIONS

Extended European Search Report for Patent Application No. 20181382.1, dated Nov. 19, 2020, 8 pages.

* cited by examiner

US 10,878,899 B1

LOW VOLTAGE, LOW POWER SENSING BASED ON LEVEL SHIFTING SENSING CIRCUIT

FIELD

Descriptions are generally related to sense amplifiers, and more particular descriptions are related to a sense amplifier sensing a level shifted version of the signal to be sensed.

BACKGROUND

A sense amplifier receives a signal and generates a digital representation of the sensed signal. The amount of power consumed by the sense amplifier depends significantly on the voltage domain of the signal to be sensed. The higher the voltage of the source signal, the higher the energy consumption. Traditional sensing circuitry is designed for differential sensing, which improves accuracy of the output. However, the differential sensing has relatively high energy consumption.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

Descriptions of certain details and implementations follow, including non-limiting descriptions of the figures, which may depict some or all examples, and well as other potential implementations.

DETAILED DESCRIPTION

As described herein, a sensing circuit for sensing an analog signal includes a level shifter that shifts the analog signal from a high voltage domain to a low voltage domain. The signal originates from the high voltage domain, and is passed to the low voltage domain through the level shifter. The high voltage domain can be, for example, from a nonvolatile memory or an I/O (input/output) pin coupled to a source line. The source line provides the analog signal, which can be selectively switched into a sense amplifier circuit. The sense amplifier is in the low voltage domain and generates a digital output to represent the sensed analog signal.

The level shifting converts a high voltage (HV) analog signal to a low voltage (LV) analog signal. While reference is made to an HV signal or HV domain and an LV signal or LV domain, it will be understood that sensing can be based on a current instead of voltage. Descriptions throughout are made with reference to high and low voltage, which will be understood as non-limiting examples. It will be understood that similar circuits can be designed to sense currents instead of voltages, and that similar principles of level shifting the current could be applied in such an implementation.

The level shifting can reduce the voltage (or current) from a higher domain to a lower domain. For example, sensing a high voltage signal can include level shifting the source signal from the HV domain to an LV domain and performing the sensing operations in the LV domain. When the sensing operations are performed entirely in the LV domain, the system does not need any high voltage level shifter or high voltage driver. The elimination of HV drivers and HV level shifters can significantly reduce energy consumption. It will be understood that when the sensing operations occur in the LV domain, control signals and systems, as well as the sensing circuitry, can all be low voltage. In one example, the level shifting is accomplished via capacitive coupling to convert an HV analog sense signal to an LV analog sense signal.

Figure 1:
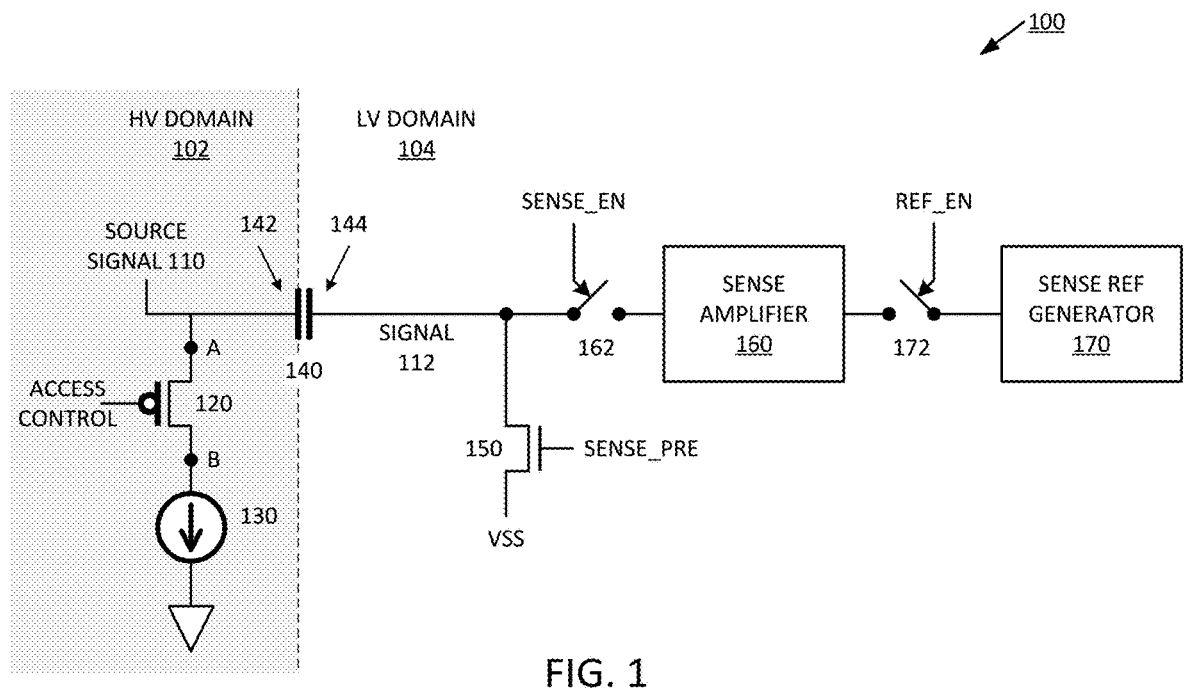
FIG. 1 is a schematic diagram of an example of a system that performs sensing with a voltage level shifter.

FIG. 1 is a schematic diagram of an example of a system that performs sensing with a voltage level shifter. System 100 includes HV domain 102 (the shaded area) and LV domain 104. In an implementation based on current instead of voltage, the domains could be high current domain and low current domain. Capacitor 140 separates the two domains. Thus, it could be said that LV domain 104 is capacitively coupled to HV domain 102, and so sense amplifier 160 is capacitively coupled to source signal 110. Signal 112 represents a level shifted version of source signal 110.

In one example, HV domain 102 includes a contact point coupled to source signal 110. Contact point A represents a contact point to the source line that can be level shifted down for sensing. Alternatively, capacitor 140 could be coupled to contact point B to level shift the source signal down for sensing.

In one example, HV domain 102 includes: current mirror or current source 130 coupled to ground and source follower transistor or access transistor 120 coupled between current source 130 and source signal 110. One side of capacitor 140 is coupled to either point A at the drain of access transistor 120 or at point B at the source of access transistor 120 at the connection between current source 130 and access transistor 120. The one side of capacitor 140 is the HV side, referenced as side 142 in system 100.

In one example, LV domain 104 includes sense precharge transistor 150 coupled between VSS and the low voltage side of capacitor 140, referenced as LV side 144 in system 100. The node that connects to the drain of precharge transistor 150 and side 144 of capacitor 140 is coupled to sense enable (sense_en) switch 162. Sense enable switch 162 enables system 100 to selectively couple sense amplifier 160 to the source signal to be sensed.

For purposes of system 100, side 142 of capacitor 140 can be considered the bottom plate of the capacitor and side 144 can be considered the top plate of capacitor 140. Such an orientation may be used to describe operation herein, but it will be understood that capacitor 140 is simply a device that holds a charge potential across its terminals or contacts. One side of capacitor 140 has a higher energy potential than the other side. Some descriptions prefer to refer to capacitor orientation with the top plate facing the higher potential and the bottom plate facing the lower potential. Unless the capacitor is electrolytic, the orientation does not affect the operations described herein.

In one example, capacitor 140 is implemented through a high voltage transistor. Capacitor 140 is a series capacitor that buffers the charge between HV domain 102 and LV domain 102. In one example, capacitor 140 provides a capacitor multiplier divider effect. For example, if the level shifted version of signal 112 would be approximately 300 mV for a '1' bit, then the actual output through capacitor 140 may be approximately 270 mV for signal 112. For a zero bit, the output of signal 112 would be approximately Vss.

LV domain 104 also includes sense references (REF) generator 170 to generate a reference signal to enable the sensing of sense amplifier 160. In one example, generator 170 is selectively coupled to sense amplifier 160 via reference enable (REF_en) switch 172. Sense amplifier 160 uses the reference voltage from generator 170 to determine if source signal 110 is a one or a zero. It will be understood that generator 170 can also be fully within LV domain 104, allowing for lower-energy components in the generation of the reference signal, with the reference signal also being a low voltage domain signal.

In one example, generator 170 includes a trim generator to generate a trim value to adjust an offset of the reference signal. In one example, the trim generator centers the reference signal on a mean of analog signal 112. Such an operation can occur through a configuration or initialization procedure, where known values are provided to sense amplifier 160, and various trims are tried to achieve a desired response from sense amplifier 160.

It will be understood that the components of HV domain 102 are high voltage devices. A high voltage device is architected to tolerate a higher voltage potential across the device without causing a breakdown of the device. For example, any device based on a CMOS (complementary metal oxide semiconductor) or MOSFET (metal oxide semiconductor field effect transistor) technology will have a thick gate oxide. It will be understood that "thick" is a relative term, but in general a thick gate device has a thicker layer of gate dielectric than a non-thick gate device. In general, a thicker gate oxide or gate dielectric will allow for a higher voltage potential across the device without inducing an electric path and causing breakdown of the device. The voltage across the path typically refers to Vgs, or the gate to source voltage. Similarly, Vgd or gate to drain voltage could be considered, but does not typically vary much from the Vgs properties. A high enough voltage will cause imperfections through the gate dielectric, eventually leading to failure as the device will have a current path from gate to source (or drain), which prevents normal operation of the device.

The thick gate devices are illustrated in system 100 with thicker lines. Thus, access transistor 120, current source 130, and capacitor 140 are illustrated as high voltage devices. It will be understood that because higher voltages are across the devices, the control signals for those devices are also higher voltage potential.

In contrast to the high voltage devices of HV domain 102, LV domain 104 can use low voltage devices. While different values could be used in different implementations, in one example, HV domain 102 may have voltage swings of approximately 5 V, for example, while LV domain 102 has voltage swings of approximately 1 V. In one specific example for a three dimensional crosspoint (3DXP) non-volatile memory device may operate between 0 and −5V, with digital outputs being 0 to 1V. Other values are possible, but it will be understood that the gates of devices in the 5V domain need to be thicker than the gates for devices operating in the 1V domain.

As the devices in HV domain 102 are thick gate devices, the devices in LV domain 104 can be thin gate devices, which would break down if operated with the voltages of the HV domain. An advantage with thin gate devices is lower power consumption. Thus, by capacitively coupling LV domain 104 through capacitor 140, all devices in LV domain 104 can operate in a lower voltage environment as compared to a traditional approach where the sense amplifier simply sensed the high voltage source signal 110 as opposed to level-shifted signal 112. In one example, LV domain 104 does not have any high voltage signal toggle, and thus needs no HV level shifters or drivers. The lack of HV devices results in much less energy use for sensing. For example, signaling a control bit in the HV domain may traditionally require approximately 1 pJ (picojoule) of energy. With only low voltage signaling for control in LV domain 104, each signal may use closer to 0.1 pJ per bit for control signaling.

An operation of system 100 can be described as follows. In one example, access transistor 120 is a source follower transistor that controls when source signal 110 is provided to be sensed. For example, access transistor 120 can be a transistor that controls the charge and discharge of a memory cell. Signal access control provides a voltage on the gate of access transistor 120 can control a read voltage level or provide access to a signal on an I/O (input/output) pin of a device. Current mirror or current source 130 provides a circuit to mirror current flow in a control path for source signal 110.

As illustrated, access transistor 120 is a PMOS (p-type MOS) device, but could alternatively be an NMOS (n-type MOS) device, depending on the voltage domain and the source signal to be accessed. P-type refers to a semiconductor device where holes are the primary charge carriers that result in channel formation, and n-type refers to a semiconductor device where electrons are the primary charge carriers that result in channel formation.

Capacitor 140 represents a series coupling capacitor which acts as a level shifter and converts the high voltage analog input signal of source signal 110 to a low voltage (LV) analog input signal represented as source signal 112. In one example, the bottom plate of capacitor 140 at side 142 can be connected to either the source of the source follower (common drain amplifier) access transistor 120 (labeled as point A), or connected to the drain of current mirror 130 (labeled as point B). Point A and point B will have different voltages depending on whether source signal 110 is a one or a zero. Based on the state of source signal 110, there will be a voltage difference across current source 130 in HV domain 102. The voltage at the connected point acts as the input to sense amplifier 160, after being level shifted.

It will be understood that with different voltage signals being sensed through series capacitor 140, there could be scenarios where accumulated charge may not fully discharge from the low voltage facing side (144) of capacitor 140. Such charge could result in indeterminate states of sensing. To avoid such indeterminate states, in one example, system 100 includes precharge transistor 150. In one example, system 100 includes signal sense_pre or sense precharge to control the operation of precharge transistor 150. When the signal is asserted, precharge transistor 150 grounds the top plate of capacitor 140, thus acting as a grounding switch. Initial grounding of side 144 of capacitor 140 ensures that the top plate always starts from same potential. After some time, which is a time sufficient to fully discharge the top plate of capacitor 140, sense_pre can be deasserted to float the top plate of capacitor 140. It will be understood that the time needed to fully discharge the top plate will depend on the system architecture, including the size of the capacitor and the precharge transistor.

Once floated, system 100 can assert signal sense_en to close switch 162 and connect sense amplifier 160 to the top plate of capacitor 140. Initially floating, the top plate will begin to accumulate charge once switch 162 is closed. The charge on the bottom plate of capacitor 140 will move differently depending on whether source signal 110 is a one or zero, and will correspondingly cause a different amount of charge to accumulate on the top plate. The corresponding movement of the floated top plate of capacitor 140 will depend on the coupling ratio of the capacitances present at the plate. Coupling source signal 110 through capacitor 140 converts the high voltage analog sense signal to low voltage analog sense signal.

Floating the top plate ensures that whatever the charge on the bottom plate of capacitor 140 in the HV domain, the top plate voltage will be in between the low voltage rails, Vcc and Vss. In one example, the analog HV input will not swing more than the LV rail-to-rail voltage due to the capacitive coupling. The LV input signal of source signal 112 is passed to sense amplifier 160 for sensing. It will be understood that for sense amplifier 160 to operate to sense the input signal and generate a corresponding digital output, system 100 will assert ref_en or reference enable to close switch 172. Closing switch 172 passes the reference voltage from generator 170 to sense amplifier 160.

Figure 2:
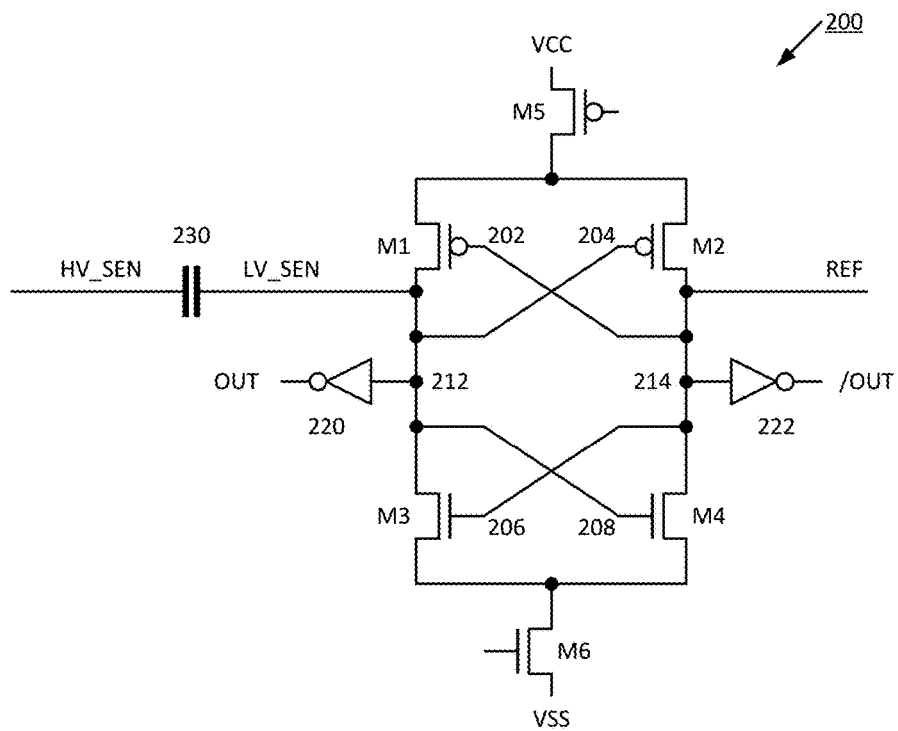
FIG. 2 is a schematic diagram of an example of a sense amplifier that senses a level shifted signal.

FIG. 2 is a schematic diagram of an example of a sense amplifier that senses a level shifted signal. Circuit 200 represents a schematic of a sense amplifier with a cross coupled pair of transistors. Circuit 200 can be in accordance with sense amplifier 160 of system 100.

In one example, circuit 200 senses a signal from a high voltage source in a low voltage domain. HV_SEN represents a high voltage signal to sense. Capacitor 230 represents a series capacitor or other level shifter to convert the input analog signal into LV_SEN for sensing. Circuit 200 senses LV EN relative to REF, which represents a reference signal.

In one example, REF is modifiable using reference trims. In one example, the reference voltage is modified using binary weighted trims. In one example, the reference voltage is modified with a trim to be placed at the mean of LV_SEN voltage for reading one and zero values, such as read SET and RESET memory cells. When SEN and REF voltages are generated, both inputs of circuit 200 can be floated. In one example, the voltages are floated using pass gates, and the sense amplifier is enabled by passing supply voltages.

M1 and M2 work as a differential input pair and amplify the input signal. After shifting the input signal down to the LV domain, the input signal may be on the order of a few hundred or several hundred millivolts (mV). The output of circuit 200 is typically a rail-to-rail output swing, which can be a higher swing than the input voltage. Thus, circuit 200 can both sense and amplify the signal for digital output.

For the operation of circuit 200, the rails are not coupled at the same time. In general, the higher signal will ultimately drive the output. However, the settling time to the output will be faster if one voltage rail is connected before the other voltage rail. Either rail could be coupled first. For purposes of discussion of the operation of circuit 200, it will be assumed that M5 is enabled to couple circuit 200 to VCC prior to enabling M6 to couple circuit 200 to VSS. First M5 is enabled to pass Vcc as a positive supply. After some time, M6 is enabled to pass Vss as a supply. The connection to Vcc and Vss allows circuit 200 to convert the amplified signal to a full swing low voltage signal (Vcc to Vss).

M1, M2, M3, and M4 work as cross coupled pairs. Depending on the SEN and REF signal inputs, the voltage output of the circuit 200 sense amplifier will flip to different directions. In one example, the output is then stored in a latch for future use. In one example, circuit 200 includes the latch. In one example, circuit 200 outputs the result to be stored in a latch external to circuit 200.

When LV_SEN is higher than REF (meaning the input is a '1'), when the input signal is initially received, the input will pull node 212 up, which will also pull up node 204 and node 208. When 204 goes up, it will shut off M2, and when 208 goes up, it will turn on M4.

With M2 shutting off and M4 turning on, node 214 will go to Vss, driving node 202 and node 206 lower. Node 202 going lower will turn on M1. Node 206 going lower will turn off M3. Turning on M1 and turning off M3 will drive node 212 higher while node 214 drives lower. As such, circuit 200 will drive inverter 220 input high and drive inverter 222 input low. The inverters will generate an inverted output OUT of '0' (inverted, amplified version of input '1' signal) and complementary output/OUT of '1' (inverted, amplified complementary version of input '1' signal).

When LV_SEN is lower than REF (meaning the input is a '0'), when the input signal is initially received, the input will pull node 212 down, which will also pull down node 204 and node 208. When 204 goes down, it will turn on M2, and when 208 goes down, it will shut off M4.

With M2 turning on and M4 turning off, node 214 will go to Vcc, driving node 202 and node 206 higher. Node 202 going higher will turn off M1. Node 206 going higher will turn on M3. Turning off M1 and turning on M3 will drive node 212 lower while node 214 drives higher. As such, circuit 200 will drive inverter 220 input low and drive inverter 222 input high. The inverters will generate an inverted output OUT of '1' (inverted, amplified version of input '0' signal) and complementary output/OUT of '0' (inverted, amplified complementary version of input '0' signal).

Figure 3A:
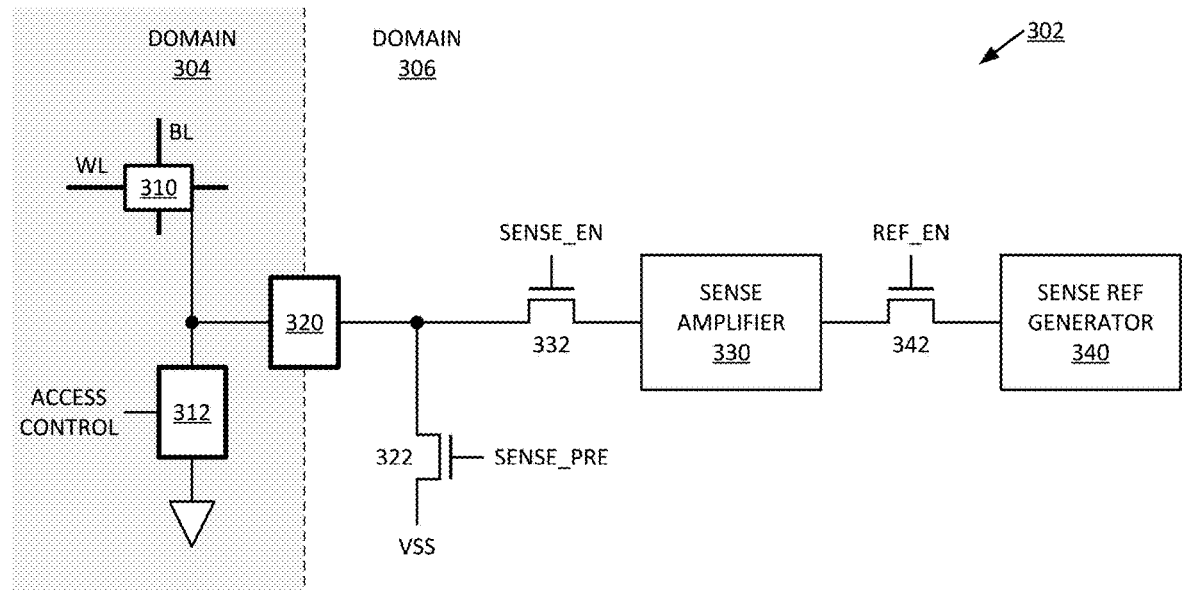
FIG. 3A is a schematic diagram of an example of a system that performs sensing of a memory cell with a voltage level shifter.

FIG. 3A is a schematic diagram of an example of a system that performs sensing of a memory cell with a voltage level shifter. System 302 provides an example of a system similar to system 100 of FIG. 1. System 302 includes domain 304 (the shaded region) and domain 306. For a voltage-based implementation, domain 304 could be referred to as the HV domain and domain 306 as the LV domain. For a current-based implementation, domain 304 could be referred to as the high current domain and domain 306 as the low current domain.

Level shifter 320 separates the two domains. In one example, level shifter 320 is a capacitor as in system 100. Level shifter 320 receives an analog signal from a source line to a source signal in domain 304 and provides a level-shifted analog signal on a source line in domain 306 to sense amplifier 330. Level shifter 320 can be other circuitry that level shifts the input signal. Circuitry 312 represents circuitry to control access to memory cell 310 and provide an input signal for sensing. Circuitry 312 can include any circuitry to access a signal line to read a bit from memory cell 310, and can also control programming of the memory cell. Circuitry 312 is responsive to an access control signal to enable access to memory cell 310.

Memory cell 310 represents a signal source for system 302. In one example, memory cell 310 represents a nonvolatile memory cell, which stores data in a way that will maintain its state even if power is interrupted to memory cell 310. A nonvolatile memory cell is contrasted with a volatile memory cell whose state is indeterminate if power is interrupted. In one example, memory cell 310 represents a 3DXP memory cell. In one example, memory cell 310 represents a NAND memory cell. In one example, memory cell 310 represents a NOR memory cell. System 302 illustrates memory cell 310 as being at an intersection of a wordline (WL) and bitline (BL). In general, the wordline represents a signal line that charges a memory cell in response to a row address and the bitline represents a signal line that enables access to the memory cell when selected with a column address. In a 3DXP memory cell, the memory cell is located between the conductive lines, at an intersection of the conductors with a resistive-based material. Memory cell 310 can be part of a memory array that is two dimensional (i.e., planar) or 3D (e.g., stacked in layers).

Level shifter 320 level shifts a signal to be sensed from domain 304 to domain 306. In one example, system 302 includes switch 322 to enable fully discharging the input sense signal line (SEN) to sense amplifier 330. The signal line can then be floated to enable a low voltage or low current analog signal input for sense amplifier 330. Switch 332 couples sense amplifier 330 to the input signal responsive to a sense enable (sense_en) signal.

In one example, system 302 includes sense reference (ref) generator 340 to provide a sense reference. The reference voltage or reference current from generator 340 is passed to sense amplifier 330 through switch 342 responsive to a reference enable (ref_en) signal. The reference signal allows sense amplifier 330 to sense the input signal in domain 306, without the need for high voltage or high current components. The high voltage or high current can exist only on one side of level shifter 320 to enable lower energy sensing in domain 306.

Figure 3B:
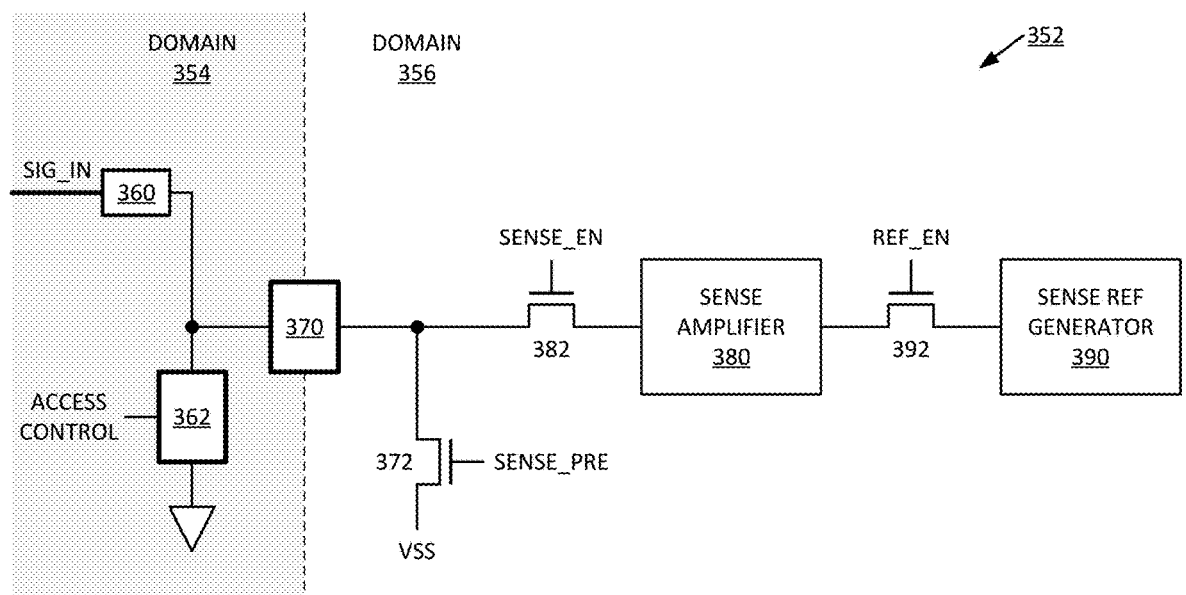
FIG. 3B is a schematic diagram of an example of a system that performs sensing of an external signal with a voltage level shifter.

FIG. 3B is a schematic diagram of an example of a system that performs sensing of an external signal with a voltage level shifter. System 352 provides an example of a system similar to system 100 of FIG. 1. System 352 includes domain 354 (the shaded region) and domain 356. For a voltage-based implementation, domain 354 could be referred to as the HV domain and domain 356 as the LV domain. For a current-based implementation, domain 354 could be referred to as the high current domain and domain 356 as the low current domain.

Level shifter 370 separates the two domains. In one example, level shifter 370 is a capacitor. Level shifter 370 receives an analog signal from a source line to a source signal in domain 354 and provides a level-shifted analog signal on a source line in domain 356 to sense amplifier 380. Level shifter 370 can be other circuitry that level shifts the input signal. Circuitry 362 represents circuitry to control access to I/O contact 360 and provide an input signal for sensing from the I/O contact. Circuitry 362 can include any circuitry to access a signal line to read a bit from I/O contact 360. Circuitry 362 is responsive to an access control signal to enable access to I/O contact 360.

I/O contact 360 represents a contact or pin that couples to a device outside of a system of which system 352 is part, and receives an input signal to be sensed. I/O contact 360 represents a signal source for system 352. In one example, I/O contact 360 couples to some high voltage, analog signal in. In one example, system 352 can be part of an analog frontend (AFE) circuit to provide a digital signal representation of a sensed analog input.

Level shifter 370 level shifts a signal to be sensed from domain 354 to domain 356. In one example, system 352 includes switch 372 to enable fully discharging the input sense signal line (SEN) to sense amplifier 330. The signal line can then be floated to enable a low voltage or low current analog signal input for sense amplifier 380. Switch 382 couples sense amplifier 380 to the input signal responsive to a sense enable (sense_en) signal.

In one example, system 352 includes sense reference (ref) generator 390 to provide a sense reference. The reference voltage or reference current from generator 390 is passed to sense amplifier 380 through switch 392 responsive to a reference enable (ref_en) signal. The reference signal allows sense amplifier 380 to sense the input signal in domain 356, without the need for high voltage or high current components. The high voltage or high current can exist only on one side of level shifter 370 to enable lower energy sensing in domain 356.

Figure 4:
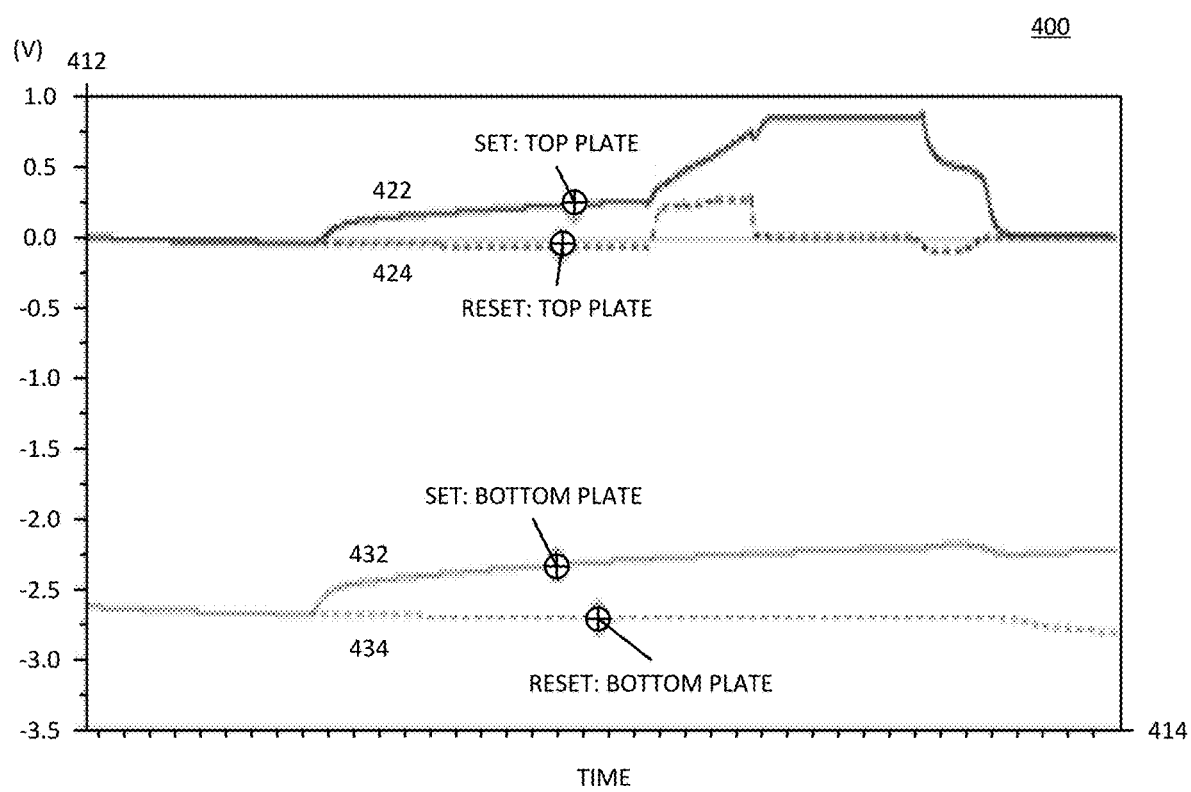
FIG. 4 is a diagrammatic representation of an example of a simulated waveform for a sensing circuit that senses a level shifted signal.

FIG. 4 is a diagrammatic representation of an example of a simulated waveform for a sensing circuit that senses a level shifted signal. Diagram 400 illustrates curves to represent the states of the different plates of a level shifting capacitor. Axis 412 represents voltage and axis 414 represents time. The specific time is not necessarily important and is thus not labeled. Where the curve starts to rise in the SET curves is when the input goes from floating to connected to the sense amplifier.

The example of diagram 400 has a voltage range of approximately 0 to 1V for the top plate and negative 2.0V to negative 3.0V for the bottom plate. More specifically, bottom plate curves represent the HV domain facing plate. Curve 432 represents the voltage on the bottom plate for a SET or a '1' for the input. The voltage swings from approximately negative 2.75V to approximately negative 2.25V. Curve 434 represents the voltage on the bottom plate for a RESET or a '0' for the input. The voltage does not swing, but stays at approximately negative 2.75V.

The top plate curves represent the LV domain facing plate. Curve 422 represents the voltage on the top plate for a SET or a '1' for the input. The voltage swings from approximately 0V to approximately 0.25V. Curve 422 then curves up to close to 1V after the sense amplifier senses the input and raises the line to the LV high voltage rail. Curve 424 represents the voltage on the top plate for a RESET or a '0' for the input. The voltage does not swing, but stays at approximately 0V.

Figure 5A:
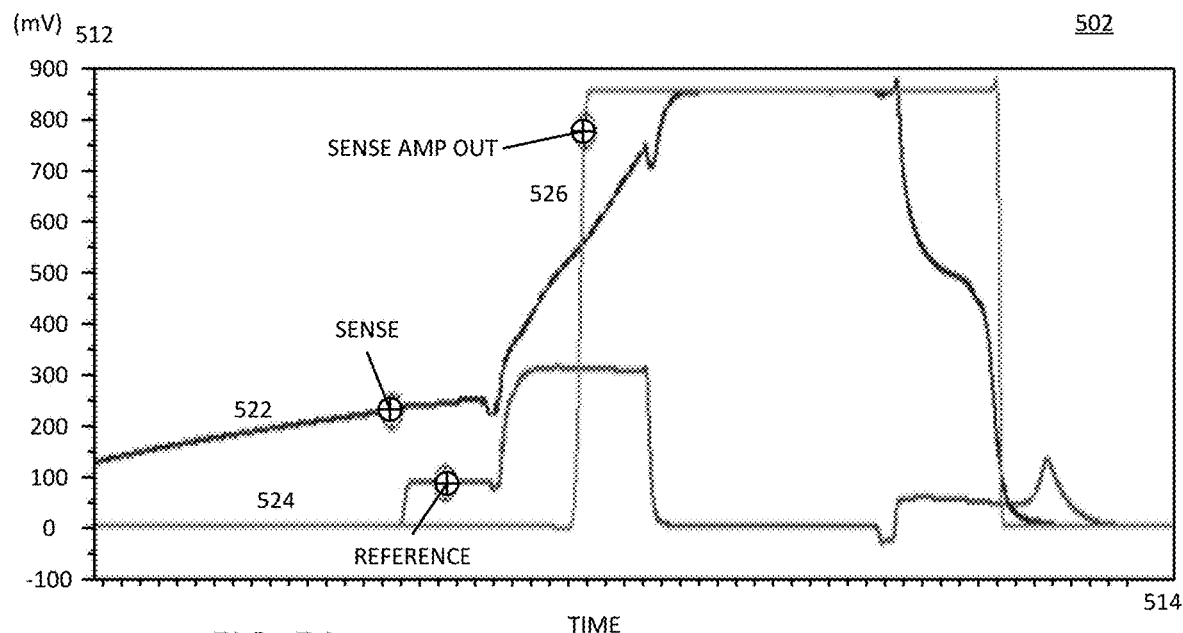
FIG. 5A is a diagrammatic representation of an example of a simulated waveform for sensing of a set memory cell with a level shifter.

FIG. 5A is a diagrammatic representation of an example of a simulated waveform for sensing of a set memory cell with a level shifter. Diagram 502 illustrates curves to represent an input '1', when the SEN input is higher than the REF input. Axis 512 represents voltage in mV and axis 514 represents time. The specific time is not necessarily important and is thus not labeled. When the curve has the significant rise in some of the curves is where the sense amplifier starts to operate to sense the input.

In diagram 502, curve 522 represents the sense signal SEN, curve 524 represents the reference signal REF, and curve 526 represents the output of the sense amplifier. Curve 522 starts to rise while floating, and then increases significantly as the sense amplifier is coupled to receive the level-shifted input signal. Curve 524 shows an initial rise as the sense amplifier lines settle to the final output. For more information refer to the description of circuit 200 above. Curve 526 illustrates how the sense amplifier output rises to a digital '1'.

Figure 5B:
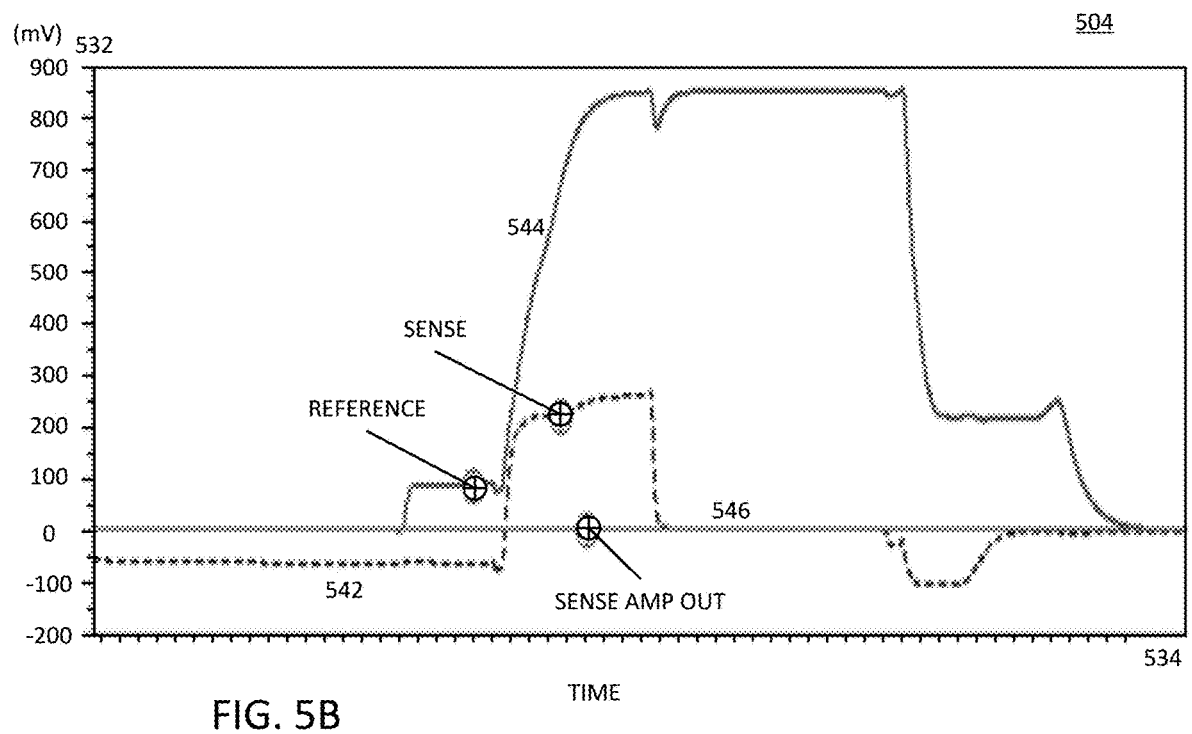
FIG. 5B is a diagrammatic representation of an example of a simulated waveform for sensing of a reset memory cell with a level shifter.

FIG. 5B is a diagrammatic representation of an example of a simulated waveform for sensing of a reset memory cell with a level shifter. Diagram 504 illustrates curves to represent an input '0', when the SEN input is lower than the REF input. Axis 532 represents voltage in mV and axis 534 represents time. The specific time is not necessarily important and is thus not labeled. When the curve has the significant rise in some of the curves is where the sense amplifier starts to operate to sense the input.

In diagram 504, curve 542 represents the sense signal SEN, curve 544 represents the reference signal REF, and curve 546 represents the output of the sense amplifier. Curve 542 has an initial rise after the sense amplifier is connected and then drops back down as the sense amplifier operation settles in response to the level-shifted input signal. Curve 544 shows a sharp rise as the lines related to the REF signal are driven high due to the input being lower than the reference signal. For more information refer to the description of circuit 200 above. Curve 546 illustrates how the sense amplifier output stays at a digital '0'.

Figure 6:
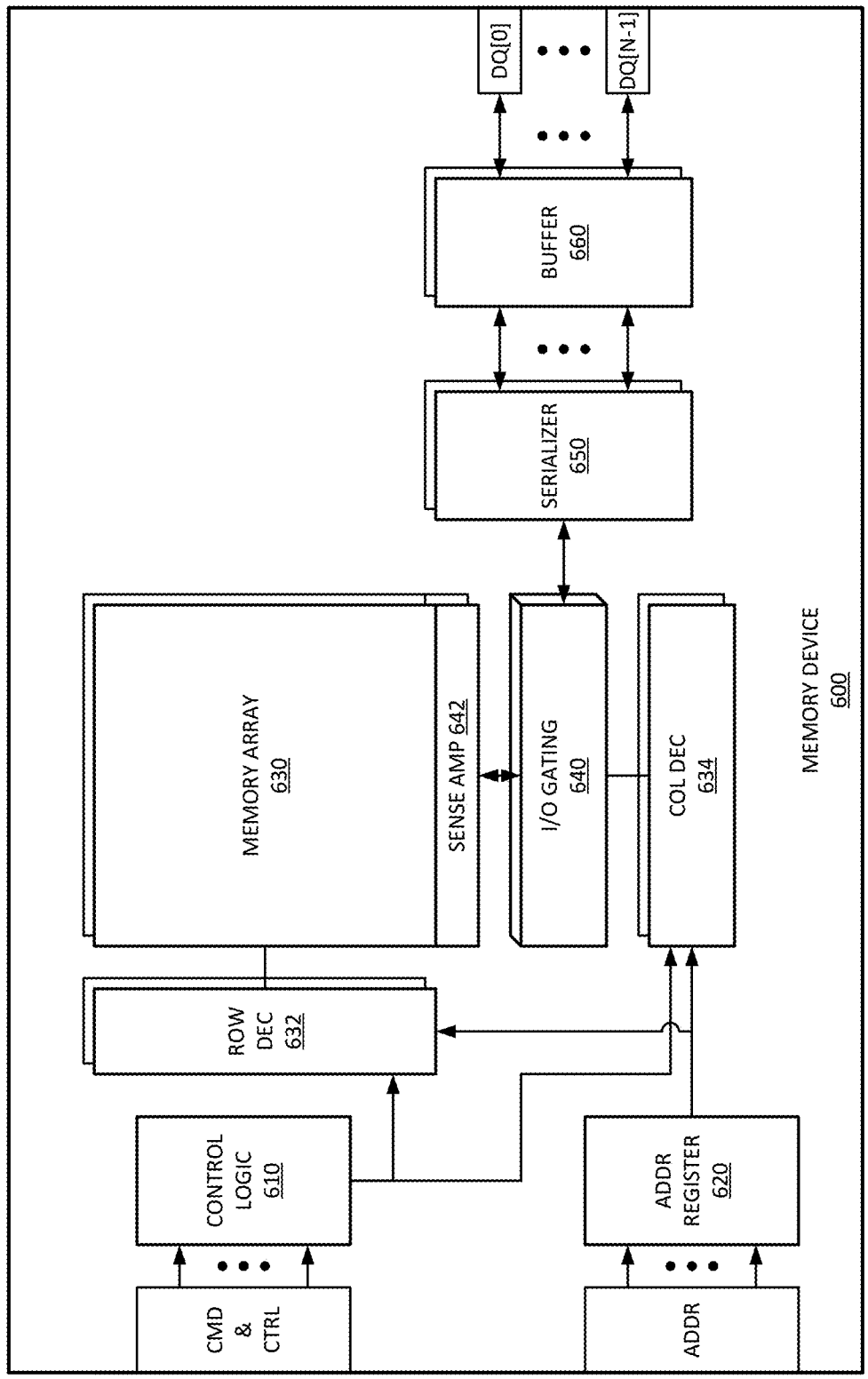
FIG. 6 is a block diagram of an example of a memory device with a sense amplifier with a level shifter to sense in a low voltage domain.

FIG. 6 is a block diagram of an example of a memory device with a sense amplifier with a level shifter to sense in a low voltage domain. Memory device 600 represents one example of a memory device in which a sense amplifier with a level shifter can be implemented. In one example, memory device 600 is a nonvolatile memory device. Memory device 600 is a memory device that has memory cells in a memory array that have a high voltage domain, and the sense amplifier is in a lower voltage domain, in accordance with any example described. For example, sense amplifier (amp) 642 can be in accordance with system 100.

Control logic 610 receives command (CMD) and control (CTRL) signals, and controls the operation of memory device 600 in relation to those signals. Address (addr) register 620 receives address information (ADDR) signals to identify the portion of memory that is to be affected by a particular command. The address and command (CMD) and control (CTRL) signals represent I/O connectors for command and address for memory device 600. In one example, address register 620 distributes the address information to row decoder (dec) 632 and column decoder (col dec) 634. The column and row decoder select specific portions of memory array 630 for execution of a command, such as read command.

In one example, memory arrays 630 can be or include subarrays. Signals from column decoder 634 activate the appropriate sense amplifiers (amp) 642 for the desired portion of memory array 630. Column decoder 634 can trigger I/O gating 640, which represent the hardware including signal lines or wires as well as logic to route data to and from memory arrays 630. I/O gating 640 can place data into sense amplifiers 642 for a write operation, and can read the data out for a read operation. Column decoder 634 makes a column selection for I/O gating 640 to select desired portions of rows in accordance with signals from row decoder 632.

Serializer 650 can represent a serializer of write data to send data to memory array 630 for programming or a serializer/deserializer to read data out from memory array 630. Buffer 660 represents a buffer for data. The buffer can be for read data to be output to the data I/O contacts (DQ[0:(N−1)]). The buffer can be for program data to be programmed to memory array 630.

In one example, sense amplifier 642 includes low voltage and high voltage domains in accordance with any example described. In accordance with examples provided herein, sense amplifier 642 is implemented in a low voltage domain, and the sense amplifier circuits are coupled through a level shifter to the source signals to sense memory array 630.

Figure 7:
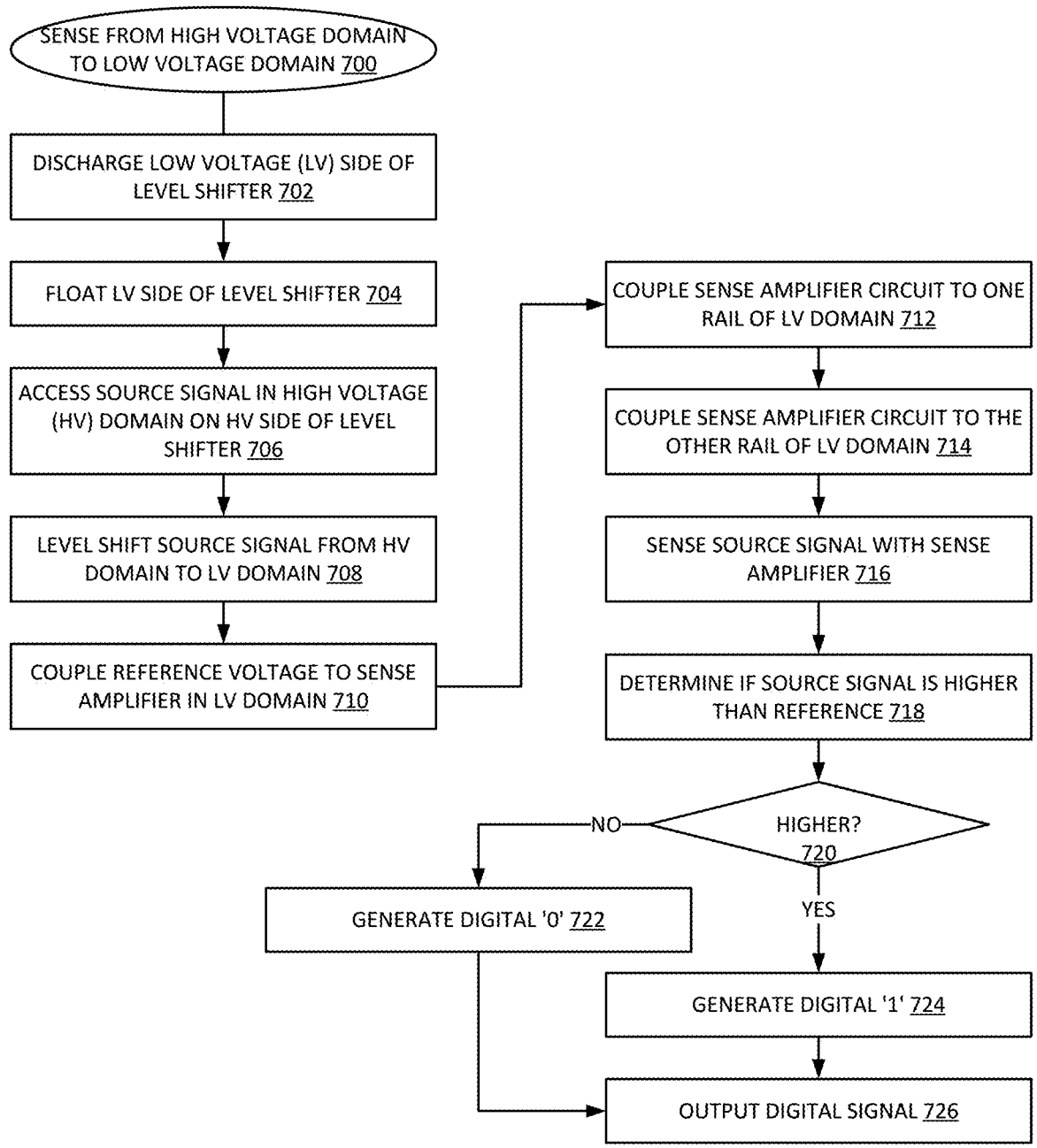
FIG. 7 is a flow diagram of an example of a process for sensing a signal from a high low voltage domain in a low voltage domain.

FIG. 7 is a flow diagram of an example of a process for sensing a signal from a high low voltage domain in a low voltage domain. Process 700 represents a process for sensing an analog input signal from a high voltage domain to a low voltage domain.

In one example, the system discharges a low voltage (LV) side of a level shifter, block 702. In one example, the system floats the LV side of the level shifter after discharging it, block 704. The system accesses the source signal in the high voltage (HV) domain on the HV side of the level shifter, block 706.

The system level shifts the source signal from the HV domain to the LV domain, block 708. The system provides control signals to couple a reference voltage signal to the sense amplifier in the LV domain, block 710. The system provides control signals to couple the sense amplifier circuit to one rail of the LV domain, block 712. The system couples the sense amplifier circuit to the other rail of the LV domain, block 714.

The sense amplifier circuit senses the level shifted source signal, block 716. The sense amplifier determines if the source signal is higher than the reference through its sense operations, block 718. If the source signal is not higher than the reference, block 720 NO branch, the sense amplifier generates a digital '0' output, block 722. If the input source signal is greater than the reference signal, block 720 YES branch, the sense amplifier generates a digital '1' output, block 724. The sense amplifier outputs the digital output, block 726.

Figure 8:
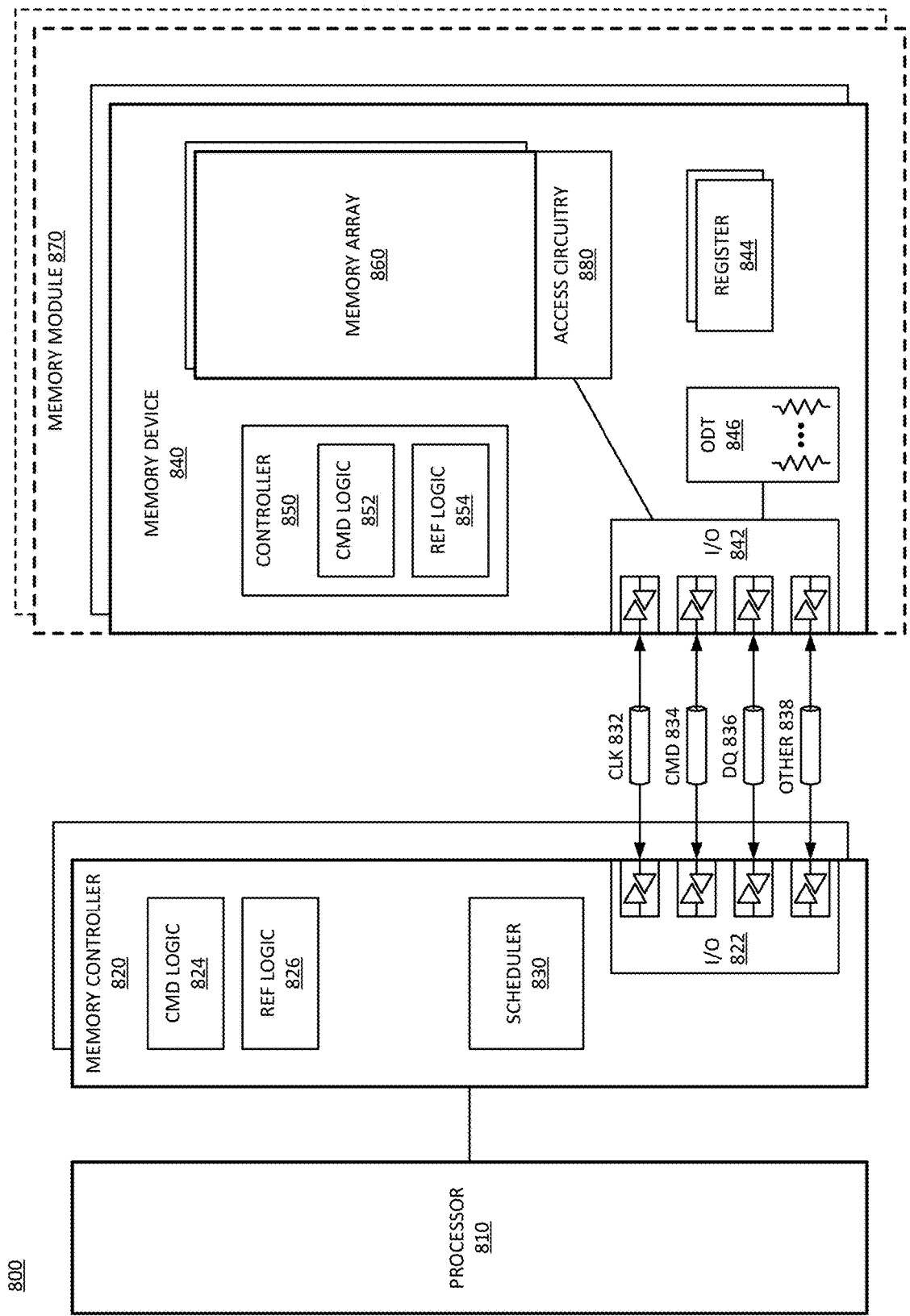
FIG. 8 is a block diagram of an example of a memory subsystem in which a level shifting sensing circuit can be implemented.

FIG. 8 is a block diagram of an example of a memory subsystem in which a level shifting sensing circuit can be implemented. System 800 includes a processor and elements of a memory subsystem in a computing device. System 800 can be in accordance with an example of system 100 of FIG. 1.

In one example, memory device 840 includes access circuitry 880 to sense read data from memory array 860. Access circuitry includes low voltage domains and high voltage domains or low current domains and high current domains in accordance with any example described. In accordance with examples provided herein, sense amplifiers of access circuitry 880 are implemented in a low voltage/current domain, and the sense amplifier circuits are coupled through a level shifter to the source signals to sense memory array 860. Signals read from memory array 860 are in the high voltage/current domain and level shifted to the low voltage/current domain for sense amplifier operation, in accordance with any example described.

Processor 810 represents a processing unit of a computing platform that may execute an operating system (OS) and applications, which can collectively be referred to as the host or the user of the memory. The OS and applications execute operations that result in memory accesses. Processor 810 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processer via a bus (e.g., PCI express), or a combination. System 800 can be implemented as an SOC (system on a chip), or be implemented with standalone components.

Reference to memory devices can apply to different memory types. Memory devices generally refer to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (Double Data Rate version 3, JESD79-3, original release by JEDEC (Joint Electronic Device Engineering Council) in June 2007), DDR4 (DDR version 4, JESD79-4, initial specification published in September 2012 by JEDEC), LPDDR3 (Low Power DDR version 3, JESD209-3, August 2013 by JEDEC), LPDDR4 (LPDDR version 4, JESD209-4, originally published by JEDEC in August 2014), WIO2 (Wide I/O 2 (WideIO2), JESD229-2, originally published by JEDEC in August 2014), HBM (High Bandwidth Memory, JESD235, originally published by JEDEC in October 2013), DDR5 (DDR version 5, currently in discussion by JEDEC), LPDDR5 (LPDDR version 5, JESD209-5, originally published by JEDEC in February 2019), HBM2 (HBM version 2, currently in discussion by JEDEC), or others or combinations of memory technologies, and technologies based on derivatives or extensions of such specifications.

In addition to, or alternatively to, volatile memory, in one example, reference to memory devices can refer to a nonvolatile memory device whose state is determinate even if power is interrupted to the device. In one example, the nonvolatile memory device is a block addressable memory device, such as NAND or NOR technologies. Thus, a memory device can also include a future generation nonvolatile devices, such as a three dimensional crosspoint memory device, other byte addressable nonvolatile memory devices, or memory devices that use chalcogenide phase change material (e.g., chalcogenide glass), or memory devices that store data based on a resistive state of a memory cell. In one example, the memory device can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Memory controller 820 represents one or more memory controller circuits or devices for system 800. Memory controller 820 represents control logic that generates memory access commands in response to the execution of operations by processor 810. Memory controller 820 accesses one or more memory devices 840. Memory devices 840 can be DRAM devices in accordance with any referred to above. In one example, memory devices 840 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one example, settings for each channel are controlled by separate mode registers or other register settings. In one example, each memory controller 820 manages a separate memory channel, although system 800 can be configured to have multiple channels managed by a single controller, or to have multiple controllers on a single channel. In one example, memory controller 820 is part of host processor 810, such as logic implemented on the same die or implemented in the same package space as the processor.

Memory controller 820 includes I/O interface logic 822 to couple to a memory bus, such as a memory channel as referred to above. I/O interface logic 822 (as well as I/O interface logic 842 of memory device 840) can include pins, pads, connectors, signal lines, traces, or wires, or other hardware to connect the devices, or a combination of these. I/O interface logic 822 can include a hardware interface. As illustrated, I/O interface logic 822 includes at least drivers/transceivers for signal lines. Commonly, wires within an integrated circuit interface couple with a pad, pin, or connector to interface signal lines or traces or other wires between devices. I/O interface logic 822 can include drivers, receivers, transceivers, or termination, or other circuitry or combinations of circuitry to exchange signals on the signal lines between the devices. The exchange of signals includes at least one of transmit or receive. While shown as coupling I/O 822 from memory controller 820 to I/O 842 of memory device 840, it will be understood that in an implementation of system 800 where groups of memory devices 840 are accessed in parallel, multiple memory devices can include I/O interfaces to the same interface of memory controller 820. In an implementation of system 800 including one or more memory modules 870, I/O 842 can include interface hardware of the memory module in addition to interface hardware on the memory device itself. Other memory controllers 820 will include separate interfaces to other memory devices 840.

The bus between memory controller 820 and memory devices 840 can be implemented as multiple signal lines coupling memory controller 820 to memory devices 840. The bus may typically include at least clock (CLK) 832, command/address (CMD) 834, and write data (DQ) and read data (DQ) 836, and zero or more other signal lines 838. In one example, a bus or connection between memory controller 820 and memory can be referred to as a memory bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one example, independent channels have different clock signals, C/A buses, data buses, and other signal lines. Thus, system 800 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 820 and memory devices 840. An example of a serial bus technology is 8B10B encoding and transmission of high-speed data with embedded clock over a single differential pair of signals in each direction. In one example, CMD 834 represents signal lines shared in parallel with multiple memory devices. In one example, multiple memory devices share encoding command signal lines of CMD 834, and each has a separate chip select (CS_n) signal line to select individual memory devices.

It will be understood that in the example of system 800, the bus between memory controller 820 and memory devices 840 includes a subsidiary command bus CMD 834 and a subsidiary bus to carry the write and read data, DQ 836. In one example, the data bus can include bidirectional lines for read data and for write/command data. In another example, the subsidiary bus DQ 836 can include unidirectional write signal lines for write and data from the host to memory, and can include unidirectional lines for read data from the memory to the host. In accordance with the chosen memory technology and system design, other signals 838 may accompany a bus or sub bus, such as strobe lines DQS. Based on design of system 800, or implementation if a design supports multiple implementations, the data bus can have more or less bandwidth per memory device 840. For example, the data bus can support memory devices that have either a x32 interface, a x16 interface, a x8 interface, or other interface. The convention "xW," where W is an integer that refers to an interface size or width of the interface of memory device 840, which represents a number of signal lines to exchange data with memory controller 820. The interface size of the memory devices is a controlling factor on how many memory devices can be used concurrently per channel in system 800 or coupled in parallel to the same signal lines. In one example, high bandwidth memory devices, wide interface devices, or stacked memory configurations, or combinations, can enable wider interfaces, such as a x128 interface, a x256 interface, a x512 interface, a x1024 interface, or other data bus interface width.

In one example, memory devices 840 and memory controller 820 exchange data over the data bus in a burst, or a sequence of consecutive data transfers. The burst corresponds to a number of transfer cycles, which is related to a bus frequency. In one example, the transfer cycle can be a whole clock cycle for transfers occurring on a same clock or strobe signal edge (e.g., on the rising edge). In one example, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length 8 (BL8), and each memory device 840 can transfer data on each UI. Thus, a x8 memory device operating on BL8 can transfer 64 bits of data (8 data signal lines times 8 data bits transferred per line over the burst). It will be understood that this simple example is merely an illustration and is not limiting.

Memory devices 840 represent memory resources for system 800. In one example, each memory device 840 is a separate memory die. In one example, each memory device 840 can interface with multiple (e.g., 2) channels per device or die. Each memory device 840 includes I/O interface logic 842, which has a bandwidth determined by the implementation of the device (e.g., x16 or x8 or some other interface bandwidth). I/O interface logic 842 enables the memory devices to interface with memory controller 820. I/O interface logic 842 can include a hardware interface, and can be in accordance with I/O 822 of memory controller, but at the memory device end. In one example, multiple memory devices 840 are connected in parallel to the same command and data buses. In another example, multiple memory devices 840 are connected in parallel to the same command bus, and are connected to different data buses. For example, system 800 can be configured with multiple memory devices 840 coupled in parallel, with each memory device responding to a command, and accessing memory resources 860 internal to each. For a Write operation, an individual memory device 840 can write a portion of the overall data word, and for a Read operation, an individual memory device 840 can fetch a portion of the overall data word. As non-limiting examples, a specific memory device can provide or receive, respectively, 8 bits of a 128-bit data word for a Read or Write transaction, or 8 bits or 16 bits (depending for a x8 or a x16 device) of a 256-bit data word. The remaining bits of the word will be provided or received by other memory devices in parallel.

In one example, memory devices 840 are disposed directly on a motherboard or host system platform (e.g., a PCB (printed circuit board) on which processor 810 is disposed) of a computing device. In one example, memory devices 840 can be organized into memory modules 870. In one example, memory modules 870 represent dual inline memory modules (DIMMs). In one example, memory modules 870 represent other organization of multiple memory devices to share at least a portion of access or control circuitry, which can be a separate circuit, a separate device, or a separate board from the host system platform. Memory modules 870 can include multiple memory devices 840, and the memory modules can include support for multiple separate channels to the included memory devices disposed on them. In another example, memory devices 840 may be incorporated into the same package as memory controller 820, such as by techniques such as multi-chip-module (MCM), package-on-package, through-silicon via (TSV), or other techniques or combinations. Similarly, in one example, multiple memory devices 840 may be incorporated into memory modules 870, which themselves may be incorporated into the same package as memory controller 820. It will be appreciated that for these and other implementations, memory controller 820 may be part of host processor 810.

Memory devices 840 each include memory resources 860. Memory resources 860 represent individual arrays of memory locations or storage locations for data. Typically, memory resources 860 are managed as rows of data, accessed via wordline (rows) and bitline (individual bits within a row) control. Memory resources 860 can be organized as separate channels, ranks, and banks of memory. Channels may refer to independent control paths to storage locations within memory devices 840. Ranks may refer to common locations across multiple memory devices (e.g., same row addresses within different devices). Banks may refer to arrays of memory locations within a memory device 840. In one example, banks of memory are divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to physical resources. For example, the same physical memory locations can be accessed over a specific channel as a specific bank, which can also belong to a rank. Thus, the organization of memory resources will be understood in an inclusive, rather than exclusive, manner.

In one example, memory devices 840 include one or more registers 844. Register 844 represents one or more storage devices or storage locations that provide configuration or settings for the operation of the memory device. In one example, register 844 can provide a storage location for memory device 840 to store data for access by memory controller 820 as part of a control or management operation. In one example, register 844 includes one or more Mode Registers. In one example, register 844 includes one or more multipurpose registers. The configuration of locations within register 844 can configure memory device 840 to operate in different "modes," where command information can trigger different operations within memory device 840 based on the mode. Additionally or in the alternative, different modes can also trigger different operation from address information or other signal lines depending on the mode. Settings of register 844 can indicate configuration for I/O settings (e.g., timing, termination or ODT (on-die termination) 846, driver configuration, or other I/O settings).

In one example, memory device 840 includes ODT 846 as part of the interface hardware associated with I/O 842. ODT 846 can be configured as mentioned above, and provide settings for impedance to be applied to the interface to specified signal lines. In one example, ODT 846 is applied to DQ signal lines. In one example, ODT 846 is applied to command signal lines. In one example, ODT 846 is applied to address signal lines. In one example, ODT 846 can be applied to any combination of the preceding. The ODT settings can be changed based on whether a memory device is a selected target of an access operation or a non-target device. ODT 846 settings can affect the timing and reflections of signaling on the terminated lines. Careful control over ODT 846 can enable higher-speed operation with improved matching of applied impedance and loading. ODT 846 can be applied to specific signal lines of I/O interface 842, 822, and is not necessarily applied to all signal lines.

Memory device 840 includes controller 850, which represents control logic within the memory device to control internal operations within the memory device. For example, controller 850 decodes commands sent by memory controller 820 and generates internal operations to execute or satisfy the commands. Controller 850 can be referred to as an internal controller, and is separate from memory controller 820 of the host. Controller 850 can determine what mode is selected based on register 844, and configure the internal execution of operations for access to memory resources 860 or other operations based on the selected mode. Controller 850 generates control signals to control the routing of bits within memory device 840 to provide a proper interface for the selected mode and direct a command to the proper memory locations or addresses. Controller 850 includes command logic 852, which can decode command encoding received on command and address signal lines. Thus, command logic 852 can be or include a command decoder. With command logic 852, memory device can identify commands and generate internal operations to execute requested commands.

Referring again to memory controller 820, memory controller 820 includes command (CMD) logic 824, which represents logic or circuitry to generate commands to send to memory devices 840. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 840, memory controller 820 can issue commands via I/O 822 to cause memory device 840 to execute the commands. In one example, controller 850 of memory device 840 receives and decodes command and address information received via I/O 842 from memory controller 820. Based on the received command and address information, controller 850 can control the timing of operations of the logic and circuitry within memory device 840 to execute the commands. Controller 850 is responsible for compliance with standards or specifications within memory device 840, such as timing and signaling requirements. Memory controller 820 can implement compliance with standards or specifications by access scheduling and control.

Memory controller 820 includes scheduler 830, which represents logic or circuitry to generate and order transactions to send to memory device 840. From one perspective, the primary function of memory controller 820 could be said to schedule memory access and other transactions to memory device 840. Such scheduling can include generating the transactions themselves to implement the requests for data by processor 810 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 820 typically includes logic such as scheduler 830 to allow selection and ordering of transactions to improve performance of system 800. Thus, memory controller 820 can select which of the outstanding transactions should be sent to memory device 840 in which order, which is typically achieved with logic much more complex that a simple first-in first-out algorithm. Memory controller 820 manages the transmission of the transactions to memory device 840, and manages the timing associated with the transaction. In one example, transactions have deterministic timing, which can be managed by memory controller 820 and used in determining how to schedule the transactions with scheduler 830.

In one example, memory controller 820 includes refresh (REF) logic 826. Refresh logic 826 can be used for memory resources that are volatile and need to be refreshed to retain a deterministic state. In one example, refresh logic 826 indicates a location for refresh, and a type of refresh to perform. Refresh logic 826 can trigger self-refresh within memory device 840, or execute external refreshes which can be referred to as auto refresh commands) by sending refresh commands, or a combination. In one example, system 800 supports all bank refreshes as well as per bank refreshes. All bank refreshes cause the refreshing of banks within all memory devices 840 coupled in parallel. Per bank refreshes cause the refreshing of a specified bank within a specified memory device 840. In one example, controller 850 within memory device 840 includes refresh logic 854 to apply refresh within memory device 840. In one example, refresh logic 854 generates internal operations to perform refresh in accordance with an external refresh received from memory controller 820. Refresh logic 854 can determine if a refresh is directed to memory device 840, and what memory resources 860 to refresh in response to the command.

Figure 9:
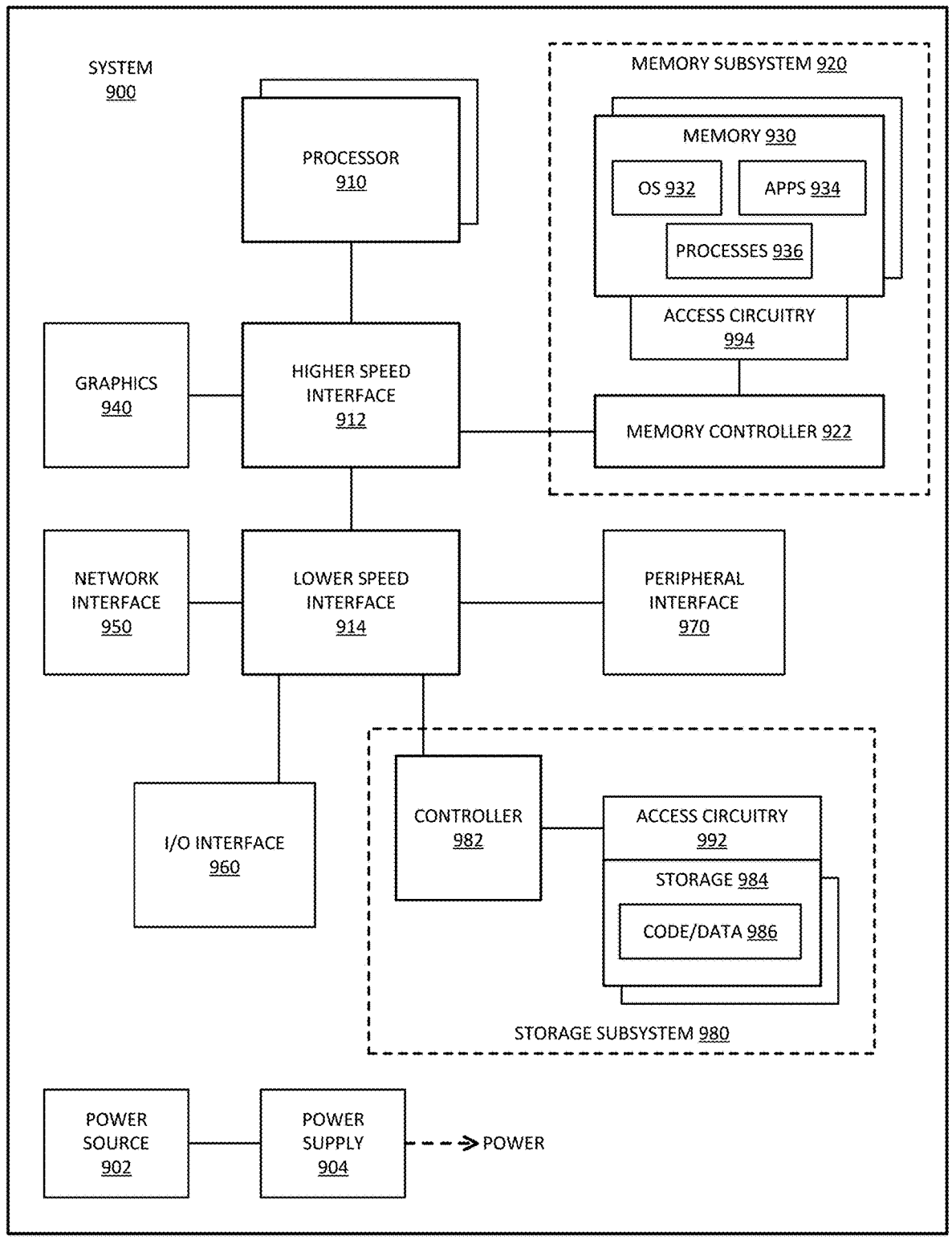
FIG. 9 is a block diagram of an example of a computing system in which a level shifting sensing circuit can be implemented.

FIG. 9 is a block diagram of an example of a computing system in which a level shifting sensing circuit can be implemented. System 900 represents a computing device in accordance with any example herein, and can be a laptop computer, a desktop computer, a tablet computer, a server, a gaming or entertainment control system, embedded computing device, or other electronic device. System 900 provides an example of a system in accordance with system 100.

In one example, system 900 includes access circuitry in either memory subsystem 920 or storage subsystem 980, or both. In one example, access circuitry 994 interfaces with memory device 930, and includes sense circuitry to sense read data from the memory. Access circuitry 994 includes low voltage domains and high voltage domains or low current domains and high current domains in accordance with any example described. In accordance with examples provided herein, sense amplifiers of access circuitry 994 are implemented in a low voltage/current domain, and the sense amplifier circuits are coupled through a level shifter to the source signals to sense memory reads. Signals read from memory 930 are in the high voltage/current domain and level shifted to the low voltage/current domain for sense amplifier operation, in accordance with any example described. In one example, access circuitry 992 interfaces with storage 984. The description of access circuitry 994 and memory 930 applies equally well to access circuitry 992 and storage 984.

System 900 includes processor 910 can include any type of microprocessor, central processing unit (CPU), graphics processing unit (GPU), processing core, or other processing hardware, or a combination, to provide processing or execution of instructions for system 900. Processor 910 controls the overall operation of system 900, and can be or include, one or more programmable general-purpose or special-purpose microprocessors, digital signal processors (DSPs), programmable controllers, application specific integrated circuits (ASICs), programmable logic devices (PLDs), or a combination of such devices.

In one example, system 900 includes interface 912 coupled to processor 910, which can represent a higher speed interface or a high throughput interface for system components that need higher bandwidth connections, such as memory subsystem 920 or graphics interface components 940. Interface 912 represents an interface circuit, which can be a standalone component or integrated onto a processor die. Interface 912 can be integrated as a circuit onto the processor die or integrated as a component on a system on a chip. Where present, graphics interface 940 interfaces to graphics components for providing a visual display to a user of system 900. Graphics interface 940 can be a standalone component or integrated onto the processor die or system on a chip. In one example, graphics interface 940 can drive a high definition (HD) display that provides an output to a user. In one example, the display can include a touchscreen display. In one example, graphics interface 940 generates a display based on data stored in memory 930 or based on operations executed by processor 910 or both.

Memory subsystem 920 represents the main memory of system 900, and provides storage for code to be executed by processor 910, or data values to be used in executing a routine. Memory subsystem 920 can include one or more memory devices 930 such as read-only memory (ROM), flash memory, one or more varieties of random access memory (RAM) such as DRAM, or other memory devices, or a combination of such devices. Memory 930 stores and hosts, among other things, operating system (OS) 932 to provide a software platform for execution of instructions in system 900. Additionally, applications 934 can execute on the software platform of OS 932 from memory 930. Applications 934 represent programs that have their own operational logic to perform execution of one or more functions. Processes 936 represent agents or routines that provide auxiliary functions to OS 932 or one or more applications 934 or a combination. OS 932, applications 934, and processes 936 provide software logic to provide functions for system 900. In one example, memory subsystem 920 includes memory controller 922, which is a memory controller to generate and issue commands to memory 930. It will be understood that memory controller 922 could be a physical part of processor 910 or a physical part of interface 912. For example, memory controller 922 can be an integrated memory controller, integrated onto a circuit with processor 910, such as integrated onto the processor die or a system on a chip.

While not specifically illustrated, it will be understood that system 900 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 900 includes interface 914, which can be coupled to interface 912. Interface 914 can be a lower speed interface than interface 912. In one example, interface 914 represents an interface circuit, which can include standalone components and integrated circuitry. In one example, multiple user interface components or peripheral components, or both, couple to interface 914. Network interface 950 provides system 900 the ability to communicate with remote devices (e.g., servers or other computing devices) over one or more networks. Network interface 950 can include an Ethernet adapter, wireless interconnection components, cellular network interconnection components, USB (universal serial bus), or other wired or wireless standards-based or proprietary interfaces. Network interface 950 can exchange data with a remote device, which can include sending data stored in memory or receiving data to be stored in memory.

In one example, system 900 includes one or more input/output (I/O) interface(s) 960. I/O interface 960 can include one or more interface components through which a user interacts with system 900 (e.g., audio, alphanumeric, tactile/touch, or other interfacing). Peripheral interface 970 can include any hardware interface not specifically mentioned above. Peripherals refer generally to devices that connect dependently to system 900. A dependent connection is one where system 900 provides the software platform or hardware platform or both on which operation executes, and with which a user interacts.

In one example, system 900 includes storage subsystem 980 to store data in a nonvolatile manner. In one example, in certain system implementations, at least certain components of storage 980 can overlap with components of memory subsystem 920. Storage subsystem 980 includes storage device(s) 984, which can be or include any conventional medium for storing large amounts of data in a nonvolatile manner, such as one or more magnetic, solid state, or optical based disks, or a combination. Storage 984 holds code or instructions and data 986 in a persistent state (i.e., the value is retained despite interruption of power to system 900). Storage 984 can be generically considered to be a "memory," although memory 930 is typically the executing or operating memory to provide instructions to processor 910. Whereas storage 984 is nonvolatile, memory 930 can include volatile memory (i.e., the value or state of the data is indeterminate if power is interrupted to system 900). In one example, storage subsystem 980 includes controller 982 to interface with storage 984. In one example controller 982 is a physical part of interface 914 or processor 910, or can include circuits or logic in both processor 910 and interface 914.

Power source 902 provides power to the components of system 900. More specifically, power source 902 typically interfaces to one or multiple power supplies 904 in system 900 to provide power to the components of system 900. In one example, power supply 904 includes an AC to DC (alternating current to direct current) adapter to plug into a wall outlet. Such AC power can be renewable energy (e.g., solar power) power source 902. In one example, power source 902 includes a DC power source, such as an external AC to DC converter. In one example, power source 902 or power supply 904 includes wireless charging hardware to charge via proximity to a charging field. In one example, power source 902 can include an internal battery or fuel cell source.

Figure 10:
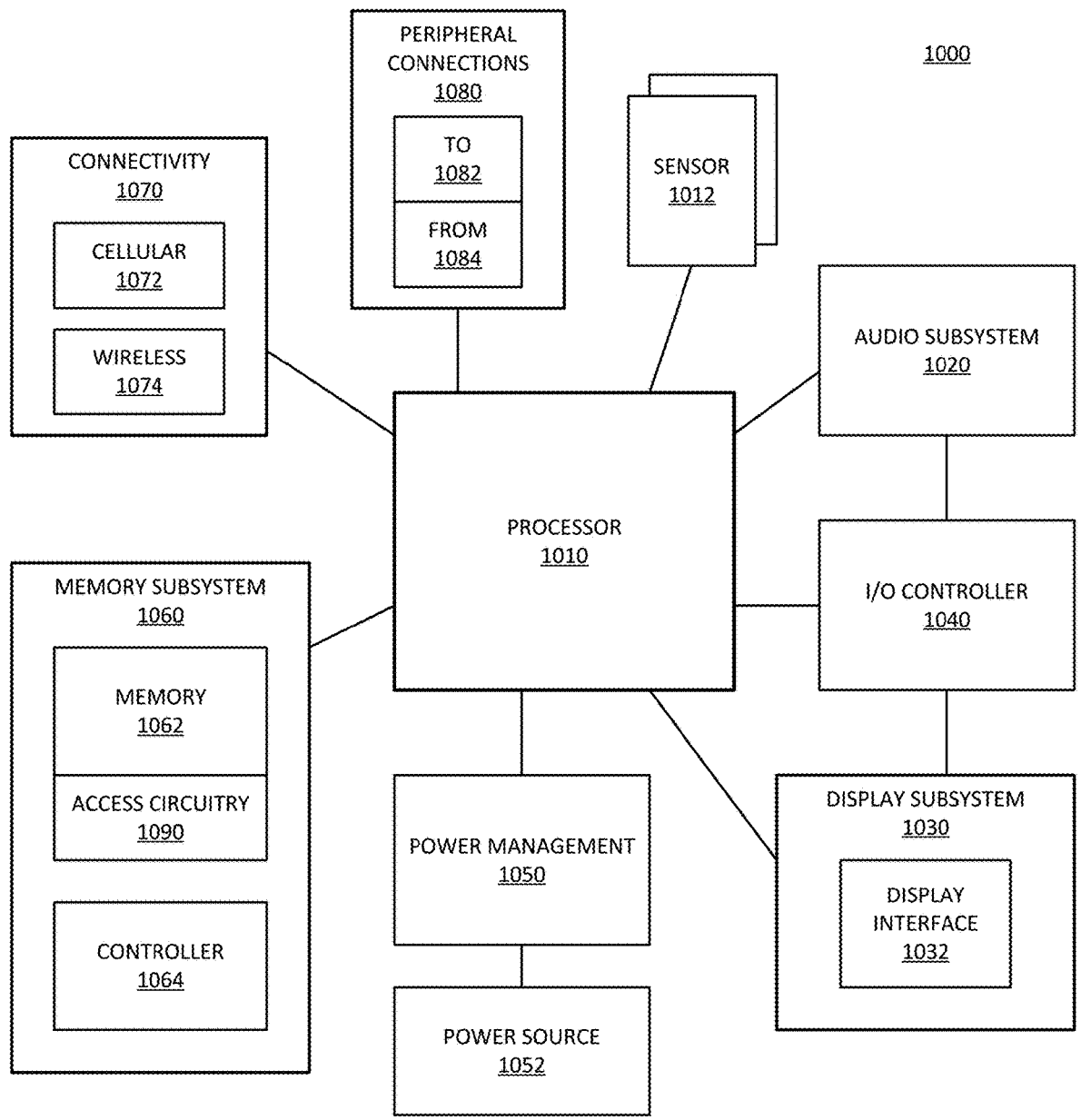
FIG. 10 is a block diagram of an example of a mobile device in which a level shifting sensing circuit can be implemented.

FIG. 10 is a block diagram of an example of a mobile device in which a level shifting sensing circuit can be implemented. System 1000 represents a mobile computing device, such as a computing tablet, a mobile phone or smartphone, wearable computing device, or other mobile device, or an embedded computing device. It will be understood that certain of the components are shown generally, and not all components of such a device are shown in system 1000. System 1000 provides an example of a system in accordance with system 100.

In one example, system 1000 includes access circuitry 1090 in memory subsystem 1060. In one example, access circuitry 1090 interfaces with memory device 1062, and includes sense circuitry to sense read data from the memory. Access circuitry 1090 includes low voltage domains and high voltage domains or low current domains and high current domains in accordance with any example described. In accordance with examples provided herein, sense amplifiers of access circuitry 1090 are implemented in a low voltage/current domain, and the sense amplifier circuits are coupled through a level shifter to the source signals to sense memory reads. Signals read from memory 1062 are in the high voltage/current domain and level shifted to the low voltage/current domain for sense amplifier operation, in accordance with any example described.

System 1000 includes processor 1010, which performs the primary processing operations of system 1000. Processor 1010 can include one or more physical devices, such as microprocessors, application processors, microcontrollers, programmable logic devices, or other processing means. The processing operations performed by processor 1010 include the execution of an operating platform or operating system on which applications and device functions are executed. The processing operations include operations related to I/O (input/output) with a human user or with other devices, operations related to power management, operations related to connecting system 1000 to another device, or a combination. The processing operations can also include operations related to audio I/O, display I/O, or other interfacing, or a combination. Processor 1010 can execute data stored in memory. Processor 1010 can write or edit data stored in memory.

In one example, system 1000 includes one or more sensors 1012. Sensors 1012 represent embedded sensors or interfaces to external sensors, or a combination. Sensors 1012 enable system 1000 to monitor or detect one or more conditions of an environment or a device in which system 1000 is implemented. Sensors 1012 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 1012 can also include sensors for biometric systems such as fingerprint recognition systems, face detection or recognition systems, or other systems that detect or recognize user features. Sensors 1012 should be understood broadly, and not limiting on the many different types of sensors that could be implemented with system 1000. In one example, one or more sensors 1012 couples to processor 1010 via a frontend circuit integrated with processor 1010. In one example, one or more sensors 1012 couples to processor 1010 via another component of system 1000.

In one example, system 1000 includes audio subsystem 1020, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into system 1000, or connected to system 1000. In one example, a user interacts with system 1000 by providing audio commands that are received and processed by processor 1010.

Display subsystem 1030 represents hardware (e.g., display devices) and software components (e.g., drivers) that provide a visual display for presentation to a user. In one example, the display includes tactile components or touchscreen elements for a user to interact with the computing device. Display subsystem 1030 includes display interface 1032, which includes the particular screen or hardware device used to provide a display to a user. In one example, display interface 1032 includes logic separate from processor 1010 (such as a graphics processor) to perform at least some processing related to the display. In one example, display subsystem 1030 includes a touchscreen device that provides both output and input to a user. In one example, display subsystem 1030 includes a high definition (HD) or ultra-high definition (UHD) display that provides an output to a user. In one example, display subsystem includes or drives a touchscreen display. In one example, display subsystem 1030 generates display information based on data stored in memory or based on operations executed by processor 1010 or both.

I/O controller 1040 represents hardware devices and software components related to interaction with a user. I/O controller 1040 can operate to manage hardware that is part of audio subsystem 1020, or display subsystem 1030, or both. Additionally, I/O controller 1040 illustrates a connection point for additional devices that connect to system 1000 through which a user might interact with the system. For example, devices that can be attached to system 1000 might include microphone devices, speaker or stereo systems, video systems or other display device, keyboard or keypad devices, or other I/O devices for use with specific applications such as card readers or other devices.

As mentioned above, I/O controller 1040 can interact with audio subsystem 1020 or display subsystem 1030 or both. For example, input through a microphone or other audio device can provide input or commands for one or more applications or functions of system 1000. Additionally, audio output can be provided instead of or in addition to display output. In another example, if display subsystem includes a touchscreen, the display device also acts as an input device, which can be at least partially managed by I/O controller 1040. There can also be additional buttons or switches on system 1000 to provide I/O functions managed by I/O controller 1040.

In one example, I/O controller 1040 manages devices such as accelerometers, cameras, light sensors or other environmental sensors, gyroscopes, global positioning system (GPS), or other hardware that can be included in system 1000, or sensors 1012. The input can be part of direct user interaction, as well as providing environmental input to the system to influence its operations (such as filtering for noise, adjusting displays for brightness detection, applying a flash for a camera, or other features).

In one example, system 1000 includes power management 1050 that manages battery power usage, charging of the battery, and features related to power saving operation. Power management 1050 manages power from power source 1052, which provides power to the components of system 1000. In one example, power source 1052 includes an AC to DC (alternating current to direct current) adapter to plug into a wall outlet. Such AC power can be renewable energy (e.g., solar power, motion based power). In one example, power source 1052 includes only DC power, which can be provided by a DC power source, such as an external AC to DC converter. In one example, power source 1052 includes wireless charging hardware to charge via proximity to a charging field. In one example, power source 1052 can include an internal battery or fuel cell source.

Memory subsystem 1060 includes memory device(s) 1062 for storing information in system 1000. Memory subsystem 1060 can include nonvolatile (state does not change if power to the memory device is interrupted) or volatile (state is indeterminate if power to the memory device is interrupted) memory devices, or a combination. Memory 1060 can store application data, user data, music, photos, documents, or other data, as well as system data (whether long-term or temporary) related to the execution of the applications and functions of system 1000. In one example, memory subsystem 1060 includes memory controller 1064 (which could also be considered part of the control of system 1000, and could potentially be considered part of processor 1010). Memory controller 1064 includes a scheduler to generate and issue commands to control access to memory device 1062.

Connectivity 1070 includes hardware devices (e.g., wireless or wired connectors and communication hardware, or a combination of wired and wireless hardware) and software components (e.g., drivers, protocol stacks) to enable system 1000 to communicate with external devices. The external device could be separate devices, such as other computing devices, wireless access points or base stations, as well as peripherals such as headsets, printers, or other devices. In one example, system 1000 exchanges data with an external device for storage in memory or for display on a display device. The exchanged data can include data to be stored in memory, or data already stored in memory, to read, write, or edit data.

Connectivity 1070 can include multiple different types of connectivity. To generalize, system 1000 is illustrated with cellular connectivity 1072 and wireless connectivity 1074. Cellular connectivity 1072 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 1074 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 1080 include hardware interfaces and connectors, as well as software components (e.g., drivers, protocol stacks) to make peripheral connections. It will be understood that system 1000 could both be a peripheral device ("to" 1082) to other computing devices, as well as have peripheral devices ("from" 1084) connected to it. System 1000 commonly has a "docking" connector to connect to other computing devices for purposes such as managing (e.g., downloading, uploading, changing, synchronizing) content on system 1000. Additionally, a docking connector can allow system 1000 to connect to certain peripherals that allow system 1000 to control content output, for example, to audiovisual or other systems.

In addition to a proprietary docking connector or other proprietary connection hardware, system 1000 can make peripheral connections 1080 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

In general with respect to the descriptions herein, in one example an apparatus includes: a source line to provide an analog signal; a level shifter to shift the analog signal from a high voltage domain to a low voltage domain; and a sense amplifier in the low voltage domain to sense the analog signal in the low voltage domain and generate a digital output to represent the analog signal.

In one example, the level shifter comprises a capacitor. In one example, the capacitor comprises a high voltage transistor. In one example, control signals to control operation of the sense amplifier comprise signals in the low voltage domain. In one example, the analog signal in the low voltage domain has a lower voltage than a swing of the digital output. In one example, the apparatus further includes: a sense amplifier switch to selectively couple the sense amplifier to an output of the level shifter; and a precharge switch to discharge the output of the level shifter and then float the output of the level shifter prior to the sense amplifier switch selectively coupling the sense amplifier to the output of the level shifter. In one example, the apparatus further includes: a reference signal generator in the low voltage domain to provide a reference signal for the low voltage domain to the sense amplifier. In one example, the reference signal generator comprises a trim generator to generate a trim value to center the reference signal on a mean of the analog signal.

In general with respect to the descriptions herein, in one example a system includes: a nonvolatile memory cell; and a sensing circuit to sense the nonvolatile memory cell, including: a source line to provide an analog signal from the nonvolatile memory cell; a level shifter to shift the analog signal from a high voltage domain to a low voltage domain; and a sense amplifier in the low voltage domain to sense the analog signal in the low voltage domain and generate a digital output to represent the analog signal.

In one example, the level shifter comprises a capacitor. In one example, the capacitor comprises a high voltage transistor. In one example, control signals to control operation of the sense amplifier comprise signals in the low voltage domain. In one example, the analog signal in the low voltage domain has a lower voltage than a swing of the digital output. In one example, the source line is to provide an analog signal from a nonvolatile memory cell. In one example, the nonvolatile memory cell comprises a three dimensional (3D) crosspoint memory cell. In one example, the nonvolatile memory cell comprises a NAND (not AND) memory cell. In one example, the system further includes one or more of: a host processor device coupled to the nonvolatile memory cell; a display communicatively coupled to a host processor; a network interface communicatively coupled to a host processor; or a battery to power the system.

In general with respect to the descriptions herein, in one example a method for sensing a signal includes: receiving an analog signal in a low voltage domain, from a level shifter that shifts the analog signal from a high voltage domain to the low voltage domain; sensing the analog signal in the low voltage domain; and generating a digital output in the low voltage domain to represent the analog signal.

In one example, the method further includes discharging an output of the level shifter; floating the output of the level shifter; and selectively coupling the sense amplifier to the output of the level shifter. In one example, the method further includes: connecting a reference signal generator to the sense amplifier in the low voltage domain to provide a reference signal for the low voltage domain. In one example, the sense amplifier includes a first transistor to couple to a high rail of the low voltage domain and a second transistor to couple to a low rail of the low voltage domain, and further comprising: switching the first transistor and the second transistor one after the other in time with control signals in the low voltage domain.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. An apparatus comprising:
a source line to provide an analog signal;
a level shifter to shift the analog signal from a high voltage domain to a low voltage domain;
a sense amplifier in the low voltage domain to sense the analog signal in the low voltage domain and generate a digital output to represent the analog signal;
a sense amplifier switch to selectively couple the sense amplifier to an output of the level shifter; and
a precharge switch to discharge the output of the level shifter and then float the output of the level shifter prior to the sense amplifier switch selectively coupling the sense amplifier to the output of the level shifter.

2. The apparatus of claim 1, wherein the level shifter comprises a capacitor.

3. The apparatus of claim 2, wherein the capacitor comprises a high voltage transistor.

4. The apparatus of claim 1, wherein control signals to control operation of the sense amplifier comprise signals in the low voltage domain.

5. The apparatus of claim 1, wherein the analog signal in the low voltage domain has a lower voltage than a swing of the digital output.

6. The apparatus of claim 1, further comprising:
a reference signal generator in the low voltage domain to provide a reference signal for the low voltage domain to the sense amplifier.

7. The apparatus of claim 6, wherein the reference signal generator comprises a trim generator to generate a trim value to center the reference signal on a mean of the analog signal.

8. A system, comprising:
a nonvolatile memory cell; and
a sensing circuit to sense the nonvolatile memory cell, including:
  a source line to provide an analog signal from the nonvolatile memory cell;
  a level shifter to shift the analog signal from a high voltage domain to a low voltage domain;
  a sense amplifier in the low voltage domain to sense the analog signal in the low voltage domain and generate a digital output to represent the analog signal;
  a sense amplifier switch to selectively couple the sense amplifier to an output of the level shifter; and
  a precharge switch to discharge the output of the level shifter and then float the output of the level shifter prior to the sense amplifier switch selectively coupling the sense amplifier to the output of the level shifter.

9. The system of claim 8, wherein the level shifter comprises a capacitor.

10. The system of claim 9, wherein the capacitor comprises a high voltage transistor.

11. The system of claim 8, wherein control signals to control operation of the sense amplifier comprise signals in the low voltage domain.

12. The system of claim 8, wherein the analog signal in the low voltage domain has a lower voltage than a swing of the digital output.

13. The system of claim 8, wherein the nonvolatile memory cell comprises a three dimensional (3D) crosspoint memory cell.

14. The system of claim 8, wherein the nonvolatile memory cell comprises a NAND (not AND) memory cell.

15. The system of claim 8, further comprising one or more of:
a host processor device coupled to the nonvolatile memory cell;
a display communicatively coupled to a host processor;
a network interface communicatively coupled to a host processor; or
a battery to power the system.

16. The system of claim 8, the sensing circuit further comprising:
a reference signal generator in the low voltage domain to provide a reference signal for the low voltage domain to the sense amplifier.

17. The system of claim 16, wherein the reference signal generator comprises a trim generator to generate a trim value to center the reference signal on a mean of the analog signal.

18. A method for sensing a signal, comprising:
discharging an output of a level shifter;
receiving an analog signal in a low voltage domain, from the level shifter that shifts the analog signal from a high voltage domain to the low voltage domain;
floating the output of the level shifter;
sensing the analog signal with a sense amplifier in the low voltage domain; and
generating a digital output in the low voltage domain to represent the analog signal.

19. The method of claim 18, further comprising:
connecting a reference signal generator to the sense amplifier in the low voltage domain to provide a reference signal for the low voltage domain.

20. The method of claim 18, wherein the sense amplifier includes a first transistor to couple to a high rail of the low voltage domain and a second transistor to couple to a low rail of the low voltage domain, and further comprising:
switching the first transistor and the second transistor one after another in time with control signals in the low voltage domain.

21. The method of claim 18, wherein sensing the analogy signal with the sense amplifier comprises comparing the output of the level shifter in the low voltage domain to a reference signal generated in the low voltage domain.

* * * * *